(12) United States Patent
Parette

(10) Patent No.: US 10,906,580 B2
(45) Date of Patent: Feb. 2, 2021

(54) METHOD FOR DETECTING A TORQUE CONTROL DEFECT OF AN ELECTRIC MOTOR OF A POWER-STEERING SYSTEM OF A MOTOR VEHICLE

(71) Applicants: CONTINENTAL AUTOMOTIVE FRANCE, Toulouse (FR); CONTINENTAL AUTOMOTIVE GMBH, Hannover (DE)

(72) Inventor: Michel Parette, Fonsorbes (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 387 days.

(21) Appl. No.: 15/743,295

(22) PCT Filed: Jul. 14, 2016

(86) PCT No.: PCT/EP2016/001222
§ 371 (c)(1),
(2) Date: Jan. 10, 2018

(87) PCT Pub. No.: WO2017/012704
PCT Pub. Date: Jan. 26, 2017

(65) Prior Publication Data
US 2018/0194391 A1 Jul. 12, 2018

(30) Foreign Application Priority Data
Jul. 20, 2015 (FR) ...................................... 15 56841

(51) Int. Cl.
*B62D 5/04* (2006.01)
*G01R 31/34* (2020.01)

(52) U.S. Cl.
CPC ......... *B62D 5/0487* (2013.01); *G01R 31/343* (2013.01); *B62D 5/0463* (2013.01)

(58) Field of Classification Search
CPC ... B62D 5/0487; B62D 5/0463; G01R 31/343
See application file for complete search history.

(56) References Cited

U.S. PATENT DOCUMENTS

2006/0043917 A1* 3/2006 Kifuku ................. B62D 5/0487
318/432
2008/0294360 A1 11/2008 Capitaneanu et al.
(Continued)

FOREIGN PATENT DOCUMENTS

| CN | 101388632 A | 3/2009 |
| CN | 102069842 A | 5/2011 |

(Continued)

OTHER PUBLICATIONS

International Search Report, dated Sep. 21, 2016, from corresponding PCT/EP2016/001222 application.

*Primary Examiner* — Alexander Satanovsky
*Assistant Examiner* — Mark I Crohn
(74) *Attorney, Agent, or Firm* — Nixon & Vanderhye

(57) ABSTRACT

Disclosed is a method for detecting a fault in an electric motor of a power-assisted steering system of an automobile vehicle. The method notably includes a step for: determination of a residual direct sinusoidal voltage and of a residual quadrature sinusoidal voltage based on the measured direct sinusoidal current, on the estimated direct sinusoidal current, on the measured quadrature sinusoidal current and on the estimated quadrature sinusoidal current; and detection of a fault when the difference between the value of the residual direct sinusoidal voltage and its moving average is greater than a first threshold and/or when the difference between the value of the quadrature sinusoidal
(Continued)

voltage and its moving average is greater than a second threshold.

20 Claims, 2 Drawing Sheets

(56) References Cited

U.S. PATENT DOCUMENTS

| | | | |
|---|---|---|---|
| 2009/0073617 A1 | 3/2009 | Gunji | |
| 2009/0224707 A1 | 9/2009 | Williams et al. | |
| 2011/0115289 A1 | 5/2011 | Kitamoto | |
| 2017/0254872 A1* | 9/2017 | Diao | ........................ H02P 6/12 |

FOREIGN PATENT DOCUMENTS

| | | |
|---|---|---|
| EP | 2 003 461 A1 | 12/2008 |
| FR | 2 874 572 A1 | 3/2006 |
| JP | 2003-026024 A | 1/2003 |
| JP | 2006-067731 | 3/2006 |
| JP | 2007-330099 | 12/2007 |
| WO | 2007/072033 A2 | 6/2007 |

* cited by examiner

METHOD FOR DETECTING A TORQUE CONTROL DEFECT OF AN ELECTRIC MOTOR OF A POWER-STEERING SYSTEM OF A MOTOR VEHICLE

The invention relates to the field of the control of an electric motor of a power-assisted steering system of an automobile vehicle and, more particularly, relates to a method for detecting a fault in the control of the torque of a three-phase electric motor of a power-assisted steering system of an automobile vehicle.

The invention is notably applicable to the detection of faults in the current control of a three-phase electric motor of the synchronous brushless type allowing the control of the power-assisted steering of an automobile vehicle.

In an automobile vehicle, the use of a synchronous "brushless" three-phase electric motor is known in order to render the steering of the vehicle comfortable. This electric motor is connected to the steering column of the vehicle in such a manner as to form a "power-assisted steering" module for the vehicle.

The control of the torque of this motor is implemented by a computer referred to as an Electronic Control Unit, or ECU. This electronic control module comprises a microcontroller and a DC/AC inverter connected, on the one hand, to said microcontroller and, on the other, to the motor via three connection pins and two resistors. Two Analog-to-Digital Converters (or ADCs) are each electrically connected to the terminals of one of the two resistors.

Thus, in order to detect a current control fault at the input of the motor, the microcontroller measures the currents at the input of the motor via the analog-digital converters. By doing so, the microcontroller can detect a short-circuit fault on one of the pins, when one of the analog-digital converters is saturated, or else in open circuit, when one of the analog-digital converters continuously measures a constant value over time.

However, in this configuration, the microcontroller cannot detect a gain or a shift on one or more phases and such a gain or such a shift are frequent and generate an incorrect value of the current measured by the microcontroller, which can lead to the generation of a variable torque applied to the motor by the microcontroller in response to the measurement carried out and thus a poor control of the steering wheel by the driver of the vehicle, which represents a serious danger.

Moreover, the existing fault detection methods require the motor to go into a mode referred to as "diagnostic mode" which involves the stopping of the power-assisted steering system of the vehicle, which represents a significant drawback.

The aim of the invention is to provide a simple, reliable and efficient solution for detecting a fault in the control of the torque of a three-phase electric motor of an automobile vehicle.

For this purpose, the aim of the invention is a method for detecting a fault in the control of the torque of a three-phase electric motor of a power-assisted steering system of an automobile vehicle, said motor comprising a first control connector, a second control connector, a third control connector, a stator and a rotor, said method comprising the steps for:
   generation of a first PWM voltage control signal for a first phase of the motor, of a second PWM voltage control signal for a second phase of the motor and of a third PWM voltage control signal for a third phase of the motor,
   estimation of a direct sinusoidal current and of a quadrature sinusoidal current in a two-phase reference frame linked to the rotor of the motor based on said first PWM voltage signal, on said second PWM voltage signal and on said third PWM voltage signal,
   measurement of the first current delivered to the first control connector of the motor and of the second current delivered to the second control connector of the motor,
   measurement of the third current delivered to the third control connector or estimation of the third current delivered to the third control connector based on the first current and on the second current,
   transformation of the first measured current, of the second measured current and of the third measured or estimated current into a direct current and into a quadrature current,
   determination of a residual direct sinusoidal voltage and of a residual quadrature sinusoidal voltage based on the measured direct sinusoidal current, on the estimated direct sinusoidal current, on the measured quadrature sinusoidal current and on the estimated quadrature sinusoidal current,
   detection of a fault when the difference between the value of the residual direct sinusoidal voltage and its moving average is greater than a first threshold and/or when the difference between the value of the residual quadrature sinusoidal voltage and its moving average is greater than a second threshold.

Thus, variations that are too high of the first value of residual voltage determined around its average value and/or variations that are too high of the second value of residual voltage determined around its average value indicate a fault in the current control of the torque of the motor by the electronic control module.

This fault may just as easily be a short-circuit or an open circuit as a gain or a phase-shift of one or more of the three phases of the three-phase electric motor.

The advantages of the present invention are:
   detecting latent faults which result in an unbalanced inverter or an unbalanced motor in addition to obvious failures (motors in short-circuit, an inverter arm in short-circuit, etc.). Moreover, this invention is compatible with the measurement of two or three currents motors;
   using only the parameters of the motor and of the inverter given for example at 20° C. and at zero current for the estimation of the currents. There is no need to add a temperature sensor for compensating the variation of the motor parameters over time with the temperature;
   not generating a current for detecting a fault so as to avoid the heating of the processor and to avoid generating an undesirable torque (in the case of a fault). This fault detection takes place in the normal control mode during operation without going into a mode referred to as 'diagnostic mode';
   detecting a non-rotating motor fault (motor phase disconnected, for example);
   detecting faults under all the conditions of operation of the system (over the whole range of temperature [−40° C., 125° C.], of supply voltage for the processor [10 V, 24V], of electric motor speed [−4000 tr/m, 4000 tr/m] for example).

The third current delivered to the third control connector of the motor may be measured or estimated. Indeed, this third current may be readily calculated based on the first current delivered to the first control connector of the motor and on the second current delivered to the second control connector of the motor given that the sum of this first current, of this second current and of this third current is zero.

According to one aspect of the invention, the method furthermore comprising, the rotor being characterized by its position defined by an angle and its speed of rotation in a reference frame linked to said stator, a step for measuring the angle of the position of the rotor and of the speed of rotation of the rotor.

Advantageously, the estimation step comprises:
a step for filtering said first PWM voltage signal, said second PWM voltage signal and said third PWM voltage signal in such a manner as to respectively obtain a first sinusoidal voltage, a second sinusoidal voltage and a third sinusoidal voltage expressed in a three-phase reference frame linked to the stator of the motor,
a step for transformation, based on the angle giving the position of the rotor, on the first sinusoidal voltage, on the second sinusoidal voltage and on the third sinusoidal voltage, into a direct sinusoidal voltage and a quadrature sinusoidal voltage expressed in a two-phase reference frame linked to the rotor of the motor,
a step for determination of an estimated direct sinusoidal current corresponding to the direct sinusoidal voltage and of an estimated quadrature sinusoidal current corresponding to the quadrature sinusoidal voltage, based on the direct sinusoidal voltage, on the quadrature sinusoidal voltage, on the speed of rotation of the rotor of the motor, on the residual direct sinusoidal voltage and on the residual quadrature sinusoidal voltage, Advantageously again, the step for transformation of the first sinusoidal voltage, of the second sinusoidal voltage and of the third sinusoidal voltage into a direct sinusoidal voltage and a quadrature sinusoidal voltage expressed in a two-phase reference frame linked to the rotor of the motor is carried out by the application of a Clark transform, of a Park transform or of a dqo ("direct quadrature zero") transform.

According to one feature of the invention, the step for transformation of the first current and of the second current into a direct current and into a quadrature current is carried out based on the determined angular position of the rotor of the motor.

Preferably, the step for determination of a residual direct sinusoidal voltage and of a residual quadrature sinusoidal voltage comprises:
a step for calculation of the difference between the intensity of the direct sinusoidal current and the intensity of the estimated direct sinusoidal current,
a step for calculation of the difference between the intensity of the quadrature sinusoidal current and the intensity of the estimated quadrature sinusoidal current.

Preferably again, the step for detecting a fault comprises:
a step for calculation of the moving average of the residual direct sinusoidal voltage and of the moving average of the residual quadrature sinusoidal voltage using the residual direct sinusoidal voltage values and the residual quadrature sinusoidal voltage continually received and using notably the speed of rotation of the rotor of the electric motor,
a step for calculation of the difference between the value of the residual direct sinusoidal voltage and its moving average,
a step for calculation of the difference between the value of the residual quadrature sinusoidal voltage and its moving average.

Advantageously, the method furthermore comprises a step for correcting the reduction in the gain of the low-pass filtering means based on the speed of rotation of the rotor of the motor.

The invention also relates to a device for detecting a fault in the control of the torque of a three-phase electric motor of a power-assisted steering system of an automobile vehicle, said motor comprising a first control connector, a second control connector, a third control connector, a stator and a rotor, said device comprising:
means for generating a first PWM voltage control signal for a first phase of the motor, a second PWM voltage control signal for a second phase of the motor and a third PWM voltage control signal for a third phase of the motor,
means for estimating a direct sinusoidal current and a quadrature sinusoidal current in a two-phase reference frame linked to the rotor of the motor using said first PWM voltage signal, said second PWM voltage signal and said third PWM voltage signal,
a unit for measuring the first current delivered to the first control connector of the motor and the second current delivered to the second control connector of the motor and for determining the third current delivered to the third control connector of the motor,
a unit for transformation of the first current, of the second current and of the third current into a direct sinusoidal current and into a quadrature sinusoidal current,
a unit for determination of a residual direct sinusoidal voltage and of a residual quadrature sinusoidal voltage based on the measured direct sinusoidal current, on the estimated direct sinusoidal current, on the measured quadrature sinusoidal current and on the estimated quadrature sinusoidal current,
a unit for detecting a fault when the difference between the value of the residual direct sinusoidal voltage and its moving average is greater than a first threshold and/or when the difference between the value of the residual quadrature sinusoidal voltage and its moving average is greater than a second threshold.

The measurement unit may be configured for measuring the third current delivered to the third control connector of the motor or else for determining said third current based on the measured values of the first current delivered to the first control connector of the motor and on the second current delivered to the second control connector of the motor, the sum of these three currents being zero.

The invention lastly relates to an automobile vehicle comprising a three-phase electric motor and a device such as previously described, said three-phase electric motor comprising a first control connector, a second control connector, a third control connector, a stator and a rotor.

Other features and advantages of the invention will become apparent from the description that follows, presented with regard to the appended figures given by way of non-limiting examples and in which identical references are given to similar objects.

The invention will now be described with reference to FIGS. 1 and 2.

Figure 1:
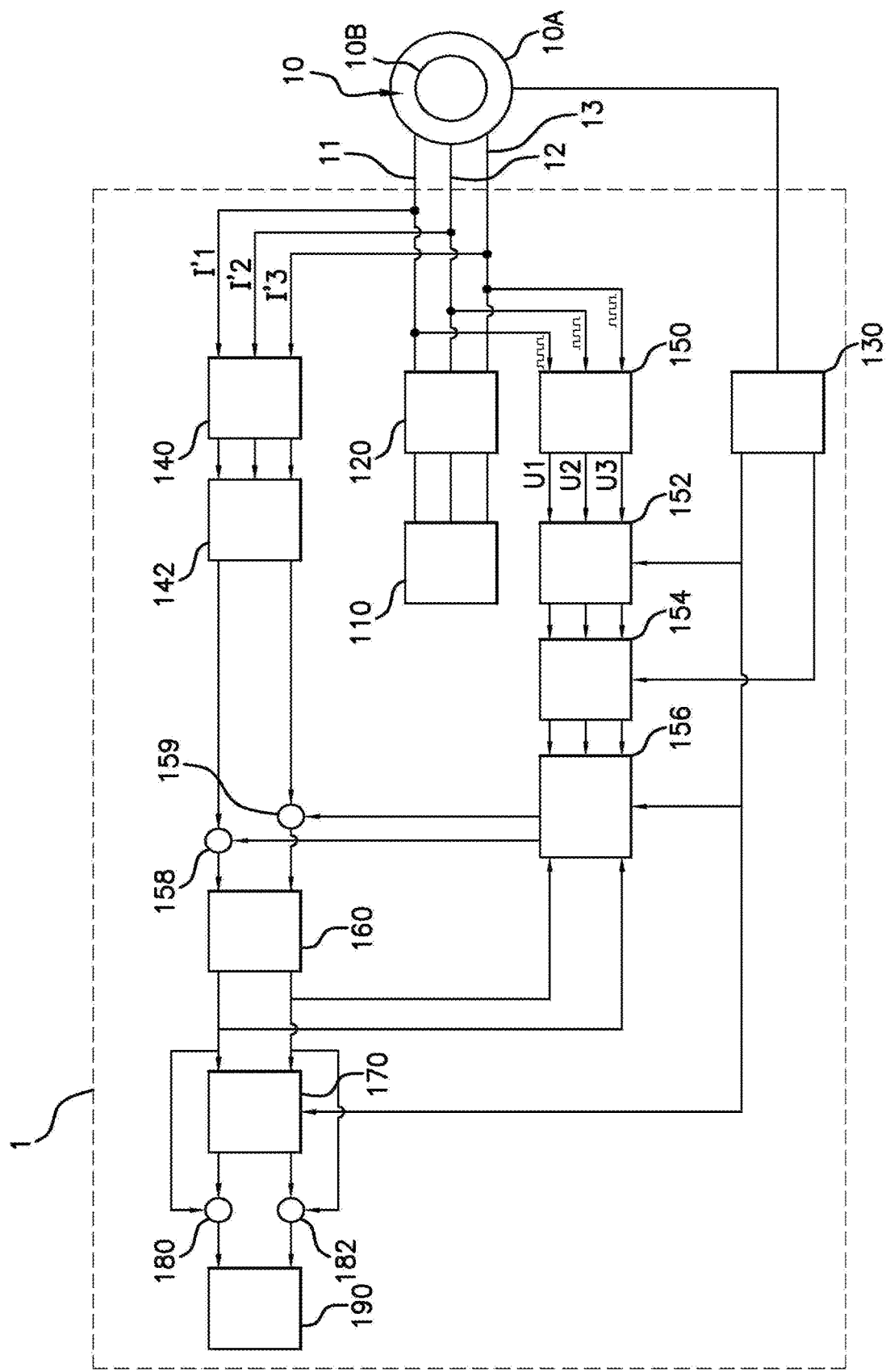
FIG. 1 illustrates schematically one embodiment of the system according to the invention.
Figure 2:
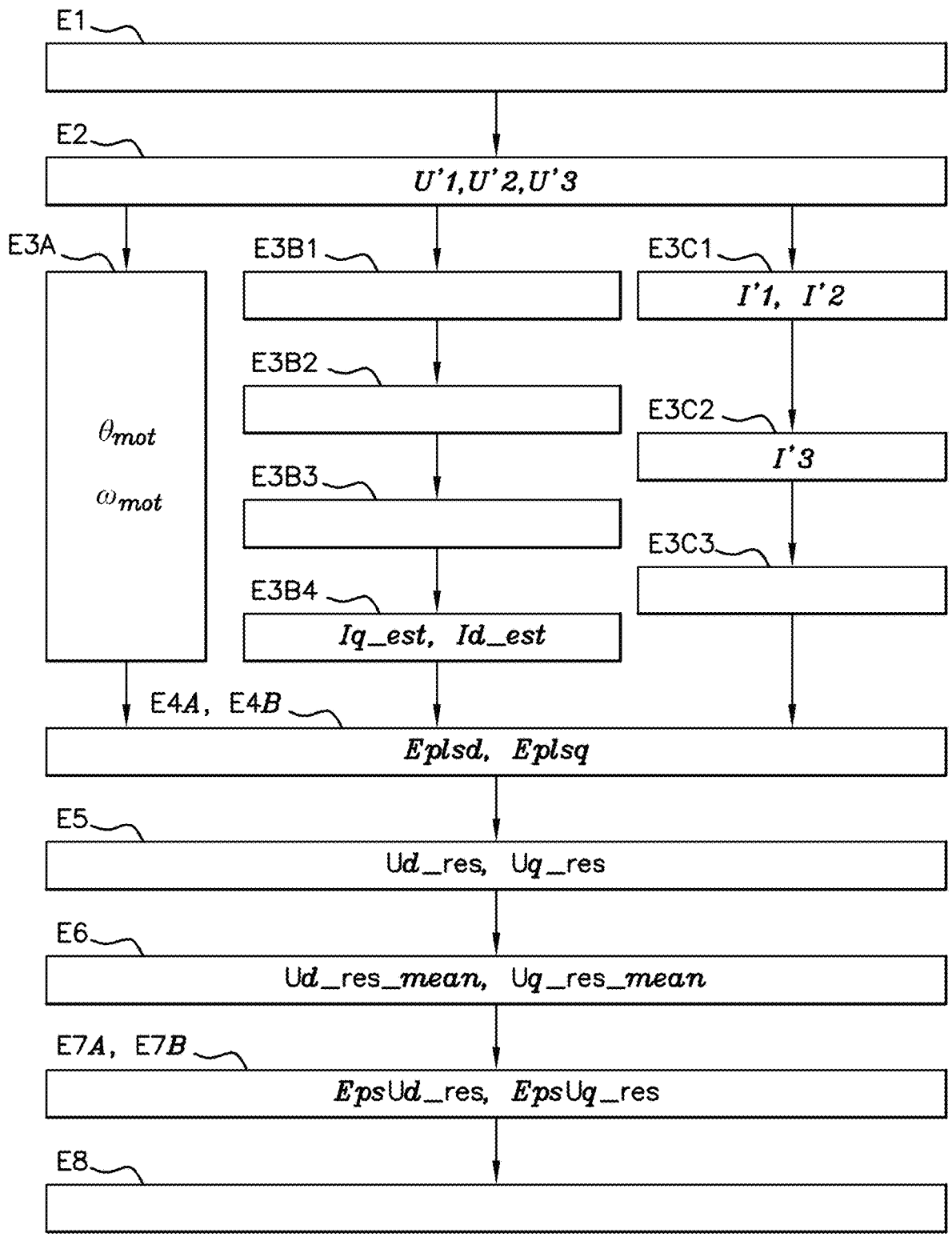
FIG. 2 illustrates schematically one embodiment of the method according to the invention.

With reference first of all to FIG. 1, the device 1 allows the detection of a fault in the control of the torque of a three-phase electric motor 10 and is, for this purpose, designed to be installed in an automobile vehicle (not shown) comprising such an three-phase electric motor 10.

Such a three-phase electric motor 10 comprises, in a known manner, a stator 10A, a rotor 10B, a first control connector 11, a second control connector 12 and a third control connector 13.

The position of the rotor 10B is defined by an angle denoted $\theta_{mot}$ in a fixed reference frame linked to the stator 10A and the speed of rotation of the rotor 10B with respect to the stator 10A is denoted $\omega_{mot}$.

In one preferred embodiment of the device 1 according to the invention, the three-phase electric motor 10 is a synchronous brushless three-phase electric motor.

Still with reference to FIG. 1, this motor 10 is controlled by a first PWM voltage signal U'1 for controlling a first phase of the motor 10, a second PWM voltage signal U'2 for controlling a second phase of the motor 10 and a third PWM voltage signal U'3 for controlling a third phase of the motor 10 generated by generation means of the device 1 comprising a microcontroller 110 and an inverter 120.

The microcontroller 110 is configured for controlling the generation, via the inverter 120, of a first PWM (for "Pulse-Width Modulation", as is known to those skilled in the art) voltage U'1, of a second PWM voltage U'2 and of a third PWM voltage U'3 with variable duty cycle (voltages not shown in FIG. 1).

The inverter 120 is for converting a DC voltage into AC voltages of the DC/AC type. This inverter 120 allows the DC voltage of the battery supplying electrical power for the vehicle, for example the battery supplying a computer of the ECU type (for "Electronic Control Unit" as is known to those skilled in the art), to be transformed into three three-phase AC voltages, respectively the first PWM voltage U'1, the second PWM voltage U'2 and the third PWM voltage U'3. For this purpose, the inverter may comprise an electronic voltage amplifier for driving a three-phase power bridge.

The first PWM voltage signal U'1 generates a first current I'1 delivered to the first control connector 11, the second PWM voltage signal U'2 generates a second current I'2 delivered to the second control connector 12 and the third PWM voltage signal U'3 generates a third current I'3 delivered to the third control connector 13 in order to control the electric motor 10 in three-phase mode in a known manner.

Aside from this microcontroller 110 and this inverter 120, the device 1 comprises a unit for measuring speed and position 130, a unit for measuring motor currents 140 and a unit for transforming the three-phase currents into two-phase currents 142.

The unit for measuring speed and position 130 is configured for measuring the angle $\theta_{mot}$ of the position of the rotor 10B and the speed of rotation $\omega_{mot}$ of the rotor 10B in a fixed reference frame linked to the stator 10A.

The unit for measuring motor currents 140 is configured for measuring a first current I'1 supplied to the first control connector 11, the second current I'2 supplied to the second control connector 12 and the third current I'3 supplied to the third control connector 13. It will be noted that only two intensities from these three currents may be measured and that the intensity of the third may be deduced from these two measurements by the measurement unit 140 by calculation, the sum of these three intensities being zero.

The unit 142 for transforming three-phase currents into two-phase currents is configured for transforming, based on the angular position $\theta_{mot}$ of the rotor 10B of the motor 10, the first current I'1, the second current I'2 and the third current I'3 measured in a fixed three-phase reference frame linked to the stator 10A into a direct current Id and a quadrature current Iq expressed in a two-phase reference frame linked to the rotor 10B of the motor 10.

The device 1 furthermore comprises means for estimating a direct sinusoidal current Id_est and a quadrature sinusoidal current I_est in a two-phase reference frame linked to the rotor 10B of the motor 10 based on said first PWM voltage signal U'1, on said second PWM voltage signal U'2 and on said third PWM voltage signal U'3.

These estimation means comprise low-pass filtering means 150, correction means 152, transformation means 154 and a unit 156 for estimating currents.

The low-pass filtering means 150, for example of the second order, allow the first PWM voltage signal U'1, the second PWM voltage signal U'2 and the third PWM voltage signal U'3 to be, respectively, transformed into a first sinusoidal voltage U1, a second sinusoidal voltage U2 and a third sinusoidal voltage U3 defined in a fixed three-phase reference frame linked to the stator 10A of the motor 10.

The correction means 152 allow the reduction in the gain of the low-pass filtering means 150 to be corrected based on the speed of rotation $\omega_{mot}$ of the rotor 10B of the motor 10. The reduction in the gain of the low-pass filters is expressed in the form: Rfiltre=$f(\omega_{mot})$ with $f(\omega_{mot})$ a polynomial of the second order for a low-pass filter of second order ($a*\omega_{mot}^2 + b*\omega_{mot}+c$)

The factor GcorrFiltre for correcting the reduction in gain is therefore expressed:

GcorrFiltre=(−Rfiltre+1).

This correction factor is applicable to all the voltages in order to correct them:

Ucorr1=U1×GcorrFiltre, Ucorr2=U2×GcorrFiltre and Ucorr3=U3×GcorrFiltre.

The means 154 for transformation of the first sinusoidal voltage U1, of the second sinusoidal voltage U2 and of the third sinusoidal voltage U3, expressed in a fixed three-phase reference frame linked to the stator 10A of the motor 10, into a direct sinusoidal voltage Ud and a quadrature sinusoidal voltage Uq, expressed in a mobile two-phase reference frame linked to the rotor 10B of the motor 10 based on the angle $e_{mot}$ giving the position of the rotor 10B.

Preferably, this transformation is carried out by application of the Clarke and/or Park and/or dqo transforms known to those skilled in the art.

The Clarke and Park transforms are mathematical tools used notably for the vector control in order to model a three-phase system by virtue of a two-phase model. This corresponds to a change of reference frame.

The Clarke and Park transforms each model a rotating machine with three windings supplied with three-phase currents by two fixed perpendicular windings, supplied with sinusoidal currents.

For a synchronous machine, as is the case here, the Clarke or Park reference frame is fixed to the stator 10A. Furthermore, in the Park reference frame, the currents of a synchronous machine have the noteworthy property of being DC.

A unit for estimating currents 156 is configured for determination of an estimated direct sinusoidal current Id_est corresponding to the direct sinusoidal voltage Ud and of an estimated quadrature sinusoidal current Iq_est corresponding to the quadrature sinusoidal voltage Uq, based on the direct sinusoidal voltage Ud, on the quadrature sinusoidal voltage Uq, on the speed of rotation $\omega_{mot}$ of the rotor 10B of the motor 10, on a residual direct sinusoidal voltage Ud_res and on a residual quadrature sinusoidal voltage Uq_res is described hereinafter.

The device furthermore comprises a first differentiator 158 configured for calculating the difference EpsId between the intensity of the direct sinusoidal current Id and the intensity of the estimated direct sinusoidal current Id_est, on the one hand, and a second differentiator 159 configured for calculating the difference EpsIq between the intensity of the quadrature sinusoidal current Iq and the intensity of the estimated quadrature sinusoidal current Iq_est, on the other.

The device 1 subsequently comprises a unit 160 for determining a residual direct sinusoidal voltage Ud_res, associated with the direct sinusoidal voltage Ud, and a residual quadrature sinusoidal voltage Uq_res, associated with the quadrature sinusoidal voltage Uq, based on the difference EpsId between the intensity of the direct sinusoidal current Id and the intensity of the estimated direct sinusoidal current Id_est and on the difference EpsIq between the intensity of the quadrature sinusoidal current Iq and the intensity of the estimated quadrature sinusoidal current Iq_est calculated, respectively, by the first differentiator 158 and the second differentiator 159.

The residual direct sinusoidal voltage Ud_res and the residual quadrature sinusoidal voltage Uq_res allow the estimated direct sinusoidal current Id_est and the estimated quadrature sinusoidal current Iq_est to be compensated in order to make them equal over time, respectively, to the direct sinusoidal current Id and to the quadrature sinusoidal current Iq, by successive iterations round a loop between the unit for estimating currents 156 and the determination unit 160 as illustrated in FIG. 1.

Indeed, without this, the electrical model of the motor does not take account of the variations of the motor parameters as a function of the temperature and of the current flowing in the stator. It is therefore necessary to compensate the difference between the estimated direct sinusoidal current Id_est and the direct sinusoidal current Id, on the one hand, and between the estimated quadrature sinusoidal current Iq_est and the quadrature sinusoidal current Iq, on the other, using the residual direct sinusoidal voltage Ud_res and the residual quadrature sinusoidal voltage Uq_res as will be described hereinafter.

For this purpose, the determination unit 160 comprises one or more proportional-integrator regulators in order to determine the residual direct sinusoidal voltage Ud_res and the residual quadrature sinusoidal voltage Uq_res. With the aim of reducing the difference between the direct current estimated Id_est and the direct current Id, during temperature and/or current variations, one uses a closed-loop control comprising a proportional-integrator regulator in order to determine the residual direct sinusoidal voltage Ud_res.

The proportional-integrator regulator with a proportional component determined by the product between the proportional factor KpUd and the difference between Id and Id_est, parallel to an integral component determined by the product between the factor KiUd and the difference between Id and Id_est allows the estimated direct sinusoidal current Id_est to be closed-loop controlled on the direct sinusoidal current Id by adding the residual direct sinusoidal voltage Ud_Res to the direct sinusoidal voltage Ud.

With the aim of reducing the difference between the estimated quadrature current Iq_est and the quadrature current Iq, when the temperature and/or current varies, a closed-loop control is used comprising a proportional-integrator regulator in order to determine the residual quadrature sinusoidal voltage Uq_res.

The proportional-integrator regulator with a proportional component determined by the product between the proportional factor KpUq and the difference between Iq and Iq_est, parallel to an integral component determined by the product between the factor KiUq and the difference between Iq and Iq_est allows the estimated quadrature sinusoidal current Iq_est to be closed-loop controlled on the quadrature sinusoidal current Iq by adding the residual quadrature sinusoidal voltage Uq_Res to the quadrature sinusoidal voltage Uq.

The device 1 subsequently comprises a unit 170 for calculating moving averages configured for calculating the moving average of the residual direct sinusoidal voltage Ud_res and the moving average of the residual quadrature sinusoidal voltage Uq_res using notably the speed $\omega_{mot}$ of rotation of the rotor of the electric motor 10.

The device 1 furthermore comprises a third differentiator 180 configured for calculating the difference EpsUd_res between the value of the residual direct sinusoidal voltage Ud_res and its moving average Ud_res_mean and a fourth differentiator 182 configured for calculating the difference EpsUq_res between the value of the direct quadrature sinusoidal voltage Uq_res and its moving average Uq_res_mean.

Lastly, the device 1 comprises a unit 190 for detecting a fault based on the difference EpsUd_res calculated by the third differentiator and on the difference EpsUq_res calculated by the fourth differentiator 182.

The invention will now be described in its embodiment with reference to FIG. 2.

The method according to the invention allows a fault to be detected in the control of the torque of the three-phase electric motor 10 such as a short-circuit, an open circuit, a voltage amplitude gain or a phase-shift between at least two of the PWM voltage signals received at the input of the motor 10.

The control of the torque of the three-phase electric motor 10 is achieved in a known manner using a first PWM voltage signal U'1 for controlling a first phase of the motor 10, a second PWM voltage signal U'2 for controlling a second phase of the motor 10 and a third PWM voltage signal U'3 for controlling a third phase of the motor 10.

For this purpose, in a step E1, the microcontroller 110 first of all controls the inverter 120, over three electrical links connecting it to the inverter 120, in order for the latter, in a step E2, to convert the DC supply voltage, for example supplied by a battery of the vehicle, respectively into a first PWM voltage signal U'1 generating a first current I'1 delivered to the first control connector 11, into a second PWM voltage signal U'2 generating a second current I'2 delivered to the second control connector 12 and into a third PWM voltage signal U'3 generating a third current I'3 delivered to the third control connector 13.

In a step E3A, the unit for measuring speed and position 130 measures the angle $\theta_{mot}$ of the position of the rotor 10B and the speed of rotation $\omega_{mot}$ of the rotor 10B.

In parallel with the step E3A, the first PWM voltage signal U'1, the second PWM voltage signal U'2 and the third PWM voltage signal U'3 are subsequently filtered, in a step E3B1, by the low-pass filtering means 150 in such a manner as to respectively obtain a first sinusoidal voltage U1, a second sinusoidal voltage U2 and a third sinusoidal voltage U3.

In a step E3B2, the correction means 152 subsequently correct the reduction in the gain of the low-pass filtering means 150 based on the speed of rotation $\omega_{mot}$ of the rotor 10B of the motor 10 as explained hereinbefore.

In a step E3B3, the transformation means 154 subsequently transform the first sinusoidal voltage U1, the second sinusoidal voltage U2 and the third sinusoidal voltage U3, into a direct sinusoidal voltage Ud and a quadrature sinusoidal voltage Uq based on the angle $\theta_{mot}$ giving the position of the rotor 10B by application of the Clarke or Park or dqo transforms.

In a step E3B4, the unit for estimating currents 156 then determines an estimated direct sinusoidal current Id_est corresponding to the direct sinusoidal voltage Ud and an estimated quadrature sinusoidal current Id_est corresponding to the quadrature sinusoidal voltage Uq, based on the direct sinusoidal voltage Ud, on the quadrature sinusoidal voltage Uq, on the speed of rotation $\omega_{mot}$ of the rotor 10B of the motor 10 by solving the following equations:

$$Ud = R20 * IdEst - Lq20 * \omega mot * IqEst + Ld20 * \frac{d(IdEst)}{dt}$$

$$Uq = R20 * IqEst + Ld20 * \omega mot * IdEst +$$

$$Lq20 * \frac{d(IqEst)}{dt} + Psi20 * \omega mot * IdEst$$

where:
R20 represents the total resistance at 20° C. of a phase composed of a half-arm of the inverter 120, on the one hand, and of the resistance of a motor phase of the stator 10A of the motor 10, on the other.
Lq20 represents the inductance in quadrature of the stator 10A of the motor 10 determined at 20° C. at zero current.
Ld20 represents the direct inductance of the stator 10A of the motor 10 determined at 20° C. and at zero current.
Psi20 represents the flux generated by the magnet of the rotor 10B of the motor 10.

Still in parallel with the step E3A, the unit for measuring the motor currents 140 measures, in a step E3C1, the first current I'1 delivered to the first control connector 11 of the motor 10 and the second current I'2 delivered to the second control connector 12 of the motor 10 and calculates, in a step E3C2, the third current I'3 delivered to the third control connector 13 of the motor 10 using the first current I'1 and the second current I'2, the sum of these three currents being zero (I'1+I'2+I'3=0).

In a step E3C3, using the angular position $\theta_{mot}$ of the rotor 10B of the motor 10 determined by the unit for measuring speed and position 130, the unit for transforming three-phase currents into two-phase currents 142 subsequently transforms the first current I'1, the second current I'2 and the third current I'3 into a direct current Id and a quadrature current Iq by applying the Clark transform, the Park transform or a dqo transform.

Subsequently, in a step E4A, the first differentiator 158 calculates the difference EpsId between the intensity of the direct sinusoidal current Id and the intensity of the estimated direct sinusoidal current Id_est.

Simultaneously, in a step E4B, the second differentiator 159 calculates the difference EpsIq between the intensity of the quadrature sinusoidal current Iq and the intensity of the estimated quadrature sinusoidal current Iq_est.

The determination unit 160 then determines, in a step E5, the residual direct sinusoidal voltage Ud_res associated with the direct sinusoidal voltage Ud, and the residual quadrature sinusoidal voltage Uq_res associated with the quadrature sinusoidal voltage Uq, based on the difference EpsId between the intensity of the direct sinusoidal current Id and the intensity of the estimated direct sinusoidal current Id_est and on the difference EpsIq between the intensity of the quadrature sinusoidal current Iq and the intensity of the estimated quadrature sinusoidal current Iq_est respectively calculated by the first differentiator 158 and the second differentiator 159, according to the following equations:

$$(Ud + UdRes) = R20 * IdEst - Lq20 * \omega mot * IqEst + Ld20 * \frac{dIdEst}{dt}$$

$$(Uq + UqRes) =$$

$$R20 * IqEst + Ld20 * \omega mot * IdEst + Lq20 * \frac{dIqEst}{dt} + Psi20 * \omega mot * IqEs$$

with:

$$UdRes = KpUd * (Id - IdEst) + \frac{KiUd * (Id - IdEst)}{p}$$

$$UqRes = KpUq * (Iq - IqEst) + \frac{KiUq * (Iq - IqEst)}{p}$$

KpUd represents the proportional component of the closed-loop feedback control comprising a proportional-integrator regulator for determining the residual direct sinusoidal voltage Ud_res.
KiUd represents the integral component of the closed-loop feedback control comprising a proportional-integrator regulator for determining the residual direct sinusoidal voltage Ud_res.
KpUq represents the proportional component of the closed-loop feedback control comprising a proportional-integrator regulator for determining the residual quadrature sinusoidal voltage Uq_res.
KiUq represents the integral component of the closed-loop feedback control comprising a proportional-integrator regulator for determining the residual quadrature sinusoidal voltage Uq_res.

In a step E6, the unit for calculating moving averages 170 subsequently calculates the moving average of the residual direct sinusoidal voltage Ud_res and the moving average of the residual quadrature sinusoidal voltage Uq_res using the values of residual direct sinusoidal voltage Ud_res and of residual quadrature sinusoidal voltage Uq_res continually received and using notably the speed $\omega_{mot}$ of rotation of the rotor of the electric motor 10.

The third differentiator 180 then subsequently calculates, in a step E7A, the difference EpsUd_res between the value of the residual direct sinusoidal voltage Ud_res and its moving average Ud_res_mean.

In parallel, in a step E7B, the fourth differentiator 182 calculates the difference EpsUq_res between the value of the direct sinusoidal voltage in quadrature Uq_res and its moving average Uq_res_mean.

In a step E8, the detection unit 190 detects a fault when the difference EpsUd_res between the value of the residual direct sinusoidal voltage Ud_res and its moving average Ud_res_mean is greater than a first threshold and/or when the difference EpsUq_res between the value of the direct sinusoidal voltage in quadrature Uq_res and its moving average Uq_res_mean is greater than a second threshold.

Thus, variations that are too large of the first value of residual voltage Ud_res determined around its average value Ud_res_mean and/or variations that are too large of the second value of residual voltage Uq_res determined around its average value Uq_res_mean indicate a fault in the current control of the torque of the motor by the electronic control module.

This fault may just as easily be a short-circuit or an open circuit as a gain or a shift of one or more of the three phases of the three-phase electric motor.

It should lastly be noted that the present invention is not limited to the examples described hereinabove and is amenable to numerous variants accessible to those skilled in the art.

The invention claimed is:

1. A method for detecting a fault in the control of the torque of a three-phase electric motor (10) of a power-assisted steering system of an automobile vehicle where the motor (10) has a first control connector (11), a second control connector (12), a third control connector (13), a stator (10A), and a rotor (10B), said method comprising steps of:
   generating (E1; E2) a first PWM voltage signal (U'1) for controlling a first phase of the motor (10), a second PWM voltage signal (U'2) for controlling a second phase of the motor (10), and a third PWM voltage signal (U'3) for controlling a third phase of the motor (10);
   estimating (E3B1; E3B2; E3B3; E3B4) a direct sinusoidal current (Id_est) and a quadrature sinusoidal current (Iq_est) in a two-phase reference frame linked to the rotor (10B) of the motor (10), the estimated direct sinusoidal current (Id_est) and the estimated quadrature sinusoidal current (Iq_est) being calculated from all of said first PWM voltage signal (U'1), said second PWM voltage signal (U'2), and said third PWM voltage signal (U'3);
   measuring (E3C1) the first current (I'1) delivered to the first control connector (11) of the motor (10), and measuring the second current (I'2) delivered to the second control connector (12) of the motor (10);
   determining (E3C2) a value of the third current (I'3), either by measuring the third current (I'3) delivered to the third control connector (13), or by estimating (E3C2) the third current (I'3) based on the first current (I'1) and the second current (I'2);
   transforming (E3C3) the first measured current (I'1), the second measured current (I'2), and the third measured or estimated current (13') into a measured direct current (Id) and into a measured quadrature current (Iq);
   determining (E4A; E4B; E5) a residual direct sinusoidal voltage (Ud_res) and a residual quadrature sinusoidal voltage (Uq_res) based on all of the measured direct sinusoidal current (Id), the estimated direct sinusoidal current (Id_est), the measured quadrature sinusoidal current (Iq), and the estimated quadrature sinusoidal current (Iq_est); and
   detecting (E6; E7A; E7B; E8) a fault when either a difference (EpsUd_res) between a value of the residual sinusoidal voltage (Ud_res) and a moving average of the residual sinusoidal voltage (Ud_res_mean) is greater than a first threshold, or a difference (EpsUq_res) between a value of the residual quadrature sinusoidal voltage (Uq_res) and a moving average of the residual quadrature sinusoidal voltage (Uq_res_mean) is greater than a second threshold.

2. The method as claimed in claim 1, further comprising: measuring an angle ($\theta_{mot}$) of the motor and a speed of rotation ($\omega_{mot}$) of the motor, wherein a position of the rotor (10B) is characterized by the angle ($\theta_{mot}$), and the speed of rotation ($\omega_{mot}$) is characterized by a reference frame linked to said stator (10A).

3. The method as claimed in claim 2, wherein the step of estimating the direct sinusoidal current (Id_est) and the quadrature sinusoidal current (Iq_est) comprises:
   filtering said first PWM voltage signal (U'1), said second PWM voltage signal (U'2), and said third PWM voltage signal (U'3) in such a manner as to respectively obtain a first sinusoidal voltage (U1), a second sinusoidal voltage (U2), and a third sinusoidal voltage (U3) expressed in a three-phase reference frame linked to the stator (10A) of the motor (10);
   transforming (E3B3) the second sinusoidal voltage (U2) and the third sinusoidal voltage (U3), based on the angle ($\theta_{mot}$) of the rotor (10B), into a direct sinusoidal voltage (Ud) and a quadrature sinusoidal voltage (Uq) expressed in a two-phase reference frame linked to the rotor (10B) of the motor (10); and
   determining both the estimated direct sinusoidal current (Id_est) corresponding to the direct sinusoidal voltage (Ud) and the estimated quadrature sinusoidal current (Iq_est) corresponding to the quadrature sinusoidal voltage (Uq), based on the direct sinusoidal voltage (Ud), on the quadrature sinusoidal voltage (Uq), the speed of rotation ($\omega_{mot}$) of the rotor (10B) of the motor (10), the residual direct sinusoidal voltage (Ud_res), and the residual quadrature sinusoidal voltage (Uq_res).

4. The method as claimed in claim 3, wherein the step of transforming (E3B3) the second sinusoidal voltage (U2) and the third sinusoidal voltage (U3) into a direct sinusoidal voltage (Ud) and a quadrature sinusoidal voltage (Uq) expressed in a two-phase reference frame linked to the rotor (10B) of the motor (10) is carried out by application of a Clark transform, application of a Park transform, or application of a dqo transform.

5. The method as claimed in claim 4, wherein the step of transforming (E3C3) the first current (I'1) and the second current (I'2) into a direct current (Id) and into a quadrature current (Iq) is carried out based on an angular position ($\theta_{mot}$) of the rotor (10B) of the motor (10).

6. The method as claimed in claim 4, wherein the step of determining the residual direct sinusoidal voltage (Ud_res) and the residual quadrature sinusoidal voltage (Uq_res) comprises:
   calculating (E4A) a difference (EpsId) between an intensity of the direct sinusoidal current (Id) and an intensity of the estimated direct sinusoidal current (Id_est), and
   calculating (E4B) a difference (EpsIq) between an intensity of the quadrature sinusoidal current (Iq) and an intensity of the estimated quadrature sinusoidal current (Iq_est).

7. The method as claimed in claim 4, wherein the step of detecting the fault comprises:
   calculating (E6) the moving average of the residual direct sinusoidal voltage (Ud_res_mean) and the moving average of the residual quadrature sinusoidal voltage (Uq_res_mean) based on values of the residual direct sinusoidal voltage (Ud_res) and of the residual quadrature sinusoidal voltage (Uq_res) that are received continually, and using the speed ($\omega_{mot}$) of rotation of the rotor (10B) of the electric motor (10);
   calculating (E7A) the difference (EpsUd_res) between the value of the residual direct sinusoidal voltage (Ud_res)

and the moving average of the residual direct sinusoidal voltage (Ud_res_mean); and calculating (E7B) the difference (EpsUq_res) between the value of the direct sinusoidal voltage in quadrature (Uq_res) and the moving average of the direct sinusoidal voltage in quadrature (Uq_res_mean).

8. The method as claimed in claim 3, wherein the step of transforming step (E3C3) the first current (I'1) and the second current (I'2) into a direct current (Id) and into a quadrature current (Iq) is carried out based on an angular position ($\theta_{mot}$) of the rotor (10B) of the motor (10).

9. The method as claimed in claim 3, wherein the step of determining the residual direct sinusoidal voltage (Ud_res) and the residual quadrature sinusoidal voltage (Uq_res) comprises:
  calculating (E4A) a difference (EpsId) between an intensity of the direct sinusoidal current (Id) and an intensity of the estimated direct sinusoidal current (Id_est), and
  calculating (E4B) a difference (EpsIq) between an intensity of the quadrature sinusoidal current (Iq) and an intensity of the estimated quadrature sinusoidal current (Iq_est).

10. The method as claimed in claim 3, wherein the steps of detecting the fault comprises:
  calculating (E6) the moving average of the residual direct sinusoidal voltage (Ud_res_mean) and the moving average of the residual quadrature sinusoidal voltage (Ud_res_mean) based on values of the residual direct sinusoidal voltage (Ud_res) and of the residual quadrature sinusoidal voltage (Uq_res) that are received continually, and using the speed ($\omega_{mot}$) of rotation of the rotor (10B) of the electric motor (10);
  calculating (E7A) the difference (EpsUd_res) between the value of the residual direct sinusoidal voltage (Ud_res) and the moving average of the residual direct sinusoidal voltage (Ud_res_mean); and
  calculating (E7B) the difference (EpsUq_res) between the value of the direct sinusoidal voltage in quadrature (Uq_res) and the moving average of the direct sinusoidal voltage in quadrature (Uq_res_mean).

11. The method as claimed in claim 2, wherein the step of transforming (E3C3) the first current (I'1) and the second current (I'2) into a direct current (Id) and into a quadrature current (Iq) is carried out based on an angular position ($\theta_{mot}$) of the rotor (10B) of the motor (10).

12. The method as claimed in claim 2, wherein the step of determining the residual direct sinusoidal voltage (Ud_res) and the residual quadrature sinusoidal voltage (Uq_res) comprises:
  calculating (E4A) a difference (EpsId) between an intensity of the direct sinusoidal current (Id) and an intensity of the estimated direct sinusoidal current (Id_est), and
  calculating (E4B) a difference (EpsIq) between an intensity of the quadrature sinusoidal current (Iq) and an intensity of the estimated quadrature sinusoidal current (Iq_est).

13. The method as claimed in claim 2, wherein the step of detecting the fault comprises:
  calculating (E6) the moving average of the residual direct sinusoidal voltage (Ud_res_mean) and the moving average of the residual quadrature sinusoidal voltage (Ud_res_mean) based on values of the residual direct sinusoidal voltage (Ud_res) and of the residual quadrature sinusoidal voltage (Uq_res) that are received continually, and using the speed ($\omega_{mot}$) of rotation of the rotor (10B) of the electric motor (10);
  calculating (E7A) the difference (EpsUd_res) between the value of the residual direct sinusoidal voltage (Ud_res) and the moving average of the residual direct sinusoidal voltage (Ud_res_mean); and
  calculating (E7B) the difference (EpsUq_res) between the value of the direct sinusoidal voltage in quadrature (Uq_res) and the moving average of the direct sinusoidal voltage in quadrature (Uq_res_mean).

14. The method as claimed in claim 1, wherein the step of transforming (E3C3) the first current (I'1) and the second current (I'2) into a direct current (Id) and into a quadrature current (Iq) is carried out based on an angular position ($\theta_{mot}$) of the rotor (10B) of the motor (10).

15. The method as claimed in claim 14, wherein the step of determining the residual direct sinusoidal voltage (Ud_res) and the residual quadrature sinusoidal voltage (Uq_res) comprises:
  calculating (E4A) a difference (EpsId) between an intensity of the direct sinusoidal current (Id) and an intensity of the estimated direct sinusoidal current (Id_est), and
  calculating (E4B) a difference (EpsIq) between an intensity of the quadrature sinusoidal current (Iq) and an intensity of the estimated quadrature sinusoidal current (Iq_est).

16. The method as claimed in claim 1, wherein the step of determining the residual direct sinusoidal voltage (Ud_res) and the residual quadrature sinusoidal voltage (Uq_res) comprises:
  calculating (E4A) a difference (EpsId) between an intensity of the direct sinusoidal current (Id) and an intensity of the estimated direct sinusoidal current (Id_est), and
  calculating (E4B) a difference (EpsIq) between an intensity of the quadrature sinusoidal current (Iq) and an intensity of the estimated quadrature sinusoidal current (Iq_est).

17. The method as claimed in claim 1, wherein the step of detecting the fault comprises:
  calculating (E6) the moving average of the residual direct sinusoidal voltage (Ud_res_mean) and the moving average of the residual quadrature sinusoidal voltage (Ud_res_mean) based on values of the residual direct sinusoidal voltage (Ud_res) and of the residual quadrature sinusoidal voltage (Uq_res) that are received continually, and using the speed ($\omega_{mot}$) of rotation of the rotor (10B) of the electric motor (10);
  calculating (E7A) the difference (EpsUd_res) between the value of the residual direct sinusoidal voltage (Ud_res) and the moving average of the residual direct sinusoidal voltage (Ud_res_mean); and
  calculating (E7B) the difference (EpsUq_res) between the value of the direct sinusoidal voltage in quadrature (Uq_res) and the moving average of the direct sinusoidal voltage in quadrature (Uq_res_mean).

18. The method as claimed in claim 1, further comprising:
  correcting a reduction in a gain of the low-pass filtering means (150) based on a speed of rotation ($\omega_{mot}$) of the rotor (10B) of the motor (10).

19. A device for detecting a fault in control of a torque of a three-phase electric motor (10) of a power-assisted steering system of an automobile vehicle, where the motor (10) has a first control connector (11), a second control connector (12), a third control connector (13), a stator (10A), and a rotor (10B), said device comprising:
  means (110, 120) for generating (E1; E2) a first PWM voltage signal (U'1) for controlling a first phase of the motor (10), a second PWM voltage signal (U'2) for controlling a second phase of the motor (10), and a third PWM voltage signal (U'3) for controlling a third phase of the motor (10);

estimating means for estimating (150, 152, 154, 156) a direct sinusoidal current (Id_est) and a quadrature sinusoidal current (Iq_est) in a two-phase reference frame linked to the rotor (10B) of the motor (10), the estimated direct sinusoidal current and the estimated quadrature sinusoidal current (Iq_est) being calculated from all of said first PWM voltage signal (U'1), said second PWM voltage signal (U'2), and said third PWM voltage signal (U'3);

a measuring unit (140) that measures the first current (I'1) delivered to the first control connector (11) of the motor (10), that measures the second current (I'2) delivered to the second control connector (12) of the motor (10), and determines the third current (I'3) delivered to the third control connector (13) of the motor (10);

a transformation unit (142) for transforming both the first current (I'1) and the second current (I'2) into a direct current (Id) and into a quadrature current (Iq);

a determination unit (160) for determining both a residual direct sinusoidal voltage (Ud_res) and a residual quadrature sinusoidal voltage (Uq_res), based on the measured direct sinusoidal current (Id), the estimated direct sinusoidal current (Id_est), the measured quadrature sinusoidal current (Iq), and the estimated quadrature sinusoidal current (Iq_est); and a detection unit (190) that detects a fault either i) when a difference (EpsUd_res) between a value of the residual direct sinusoidal voltage (Ud_res) and a moving average of the residual direct sinusoidal voltage (Ud_res_mean) is greater than a first threshold, or ii) when a difference (EpsUq_res) between a value of the quadrature sinusoidal voltage (Uq_res) and a moving average of the quadrature sinusoidal voltage (Uq_res_mean) is greater than a second threshold.

20. An automobile vehicle comprising a three-phase electric motor (10) and a device as claimed in claim 19, said three-phase electric motor (10) comprising a first control connector (11), a second control connector (12), a third control connector (13), a stator (10A) and a rotor (10B).

\* \* \* \* \*